United States Patent
Hudson et al.

(10) Patent No.: US 10,954,606 B2
(45) Date of Patent: Mar. 23, 2021

(54) METHODS FOR MODELING THE IMPURITY CONCENTRATION OF A SINGLE CRYSTAL SILICON INGOT

(71) Applicant: Global Wafers Co., Ltd., Hsinchu (TW)

(72) Inventors: Carissima Marie Hudson, St. Charles, MO (US); JaeWoo Ryu, Chesterfield, MO (US)

(73) Assignee: GlobalWafers CO., Ltd., Hsinchu (TW)

( * ) Notice: Subject to any disclaimer, the term of this patent is extended or adjusted under 35 U.S.C. 154(b) by 73 days.

(21) Appl. No.: 16/020,707

(22) Filed: Jun. 27, 2018

(65) Prior Publication Data
US 2020/0002837 A1    Jan. 2, 2020

(51) Int. Cl.
| | | |
|---|---|---|
| C30B 15/00 | (2006.01) |
| C30B 15/20 | (2006.01) |
| C30B 33/02 | (2006.01) |
| C30B 29/06 | (2006.01) |
| C30B 15/10 | (2006.01) |

(52) U.S. Cl.
CPC .............. *C30B 15/20* (2013.01); *C30B 15/10* (2013.01); *C30B 29/06* (2013.01); *C30B 33/02* (2013.01)

(58) Field of Classification Search
CPC ........ C30B 15/00; C30B 15/04; C30B 15/206
See application file for complete search history.

(56) References Cited

U.S. PATENT DOCUMENTS

| | | | |
|---|---|---|---|
| 3,551,807 A | 12/1970 | Kulischenko et al. |
| 4,134,785 A | 1/1979 | Lavigna et al. |
| 5,137,699 A * | 8/1992 | Azad .................. C30B 15/00 |
| | | | 117/202 |
| 5,449,883 A | 9/1995 | Tsuruta |
| 6,554,898 B2 * | 4/2003 | Lu ...................... C30B 15/14 |
| | | | 117/200 |
| 7,282,094 B2 * | 10/2007 | Kitamura ........... C30B 15/206 |
| | | | 117/13 |
| 8,317,919 B2 | 11/2012 | Bender |
| 2006/0263967 A1 | 11/2006 | Falster et al. |
| 2012/0056135 A1 | 3/2012 | DeLuca et al. |
| 2014/0167731 A1 | 6/2014 | Dubois et al. |
| 2020/0002843 A1 | 1/2020 | Hudson |

FOREIGN PATENT DOCUMENTS

| | | |
|---|---|---|
| CN | 102181919 A | 9/2011 |
| JP | S6395629 A | 4/1988 |
| JP | 2012129308 A | 7/2012 |

OTHER PUBLICATIONS

U.S. Appl. No. 16/020,701 entitled, Growth of Plural Sample Rods to Determine Impurity Build-Up During Production of Single Crystal Silicon Ingots, filed Jun. 27, 2018, 37 pgs.

(Continued)

*Primary Examiner* — Robert M Kunemund
(74) *Attorney, Agent, or Firm* — Armstrong Teasdale LLP

(57) ABSTRACT

Methods for forming single crystal silicon ingots in which plural sample rods are grown from the melt are disclosed. A parameter related to the impurity concentration of the melt or ingot is measured. In some embodiments, the sample rods each have a diameter less than the diameter of the product ingot.

17 Claims, 12 Drawing Sheets

(56) References Cited

OTHER PUBLICATIONS

ASTM International: "Standard Test Method for Resistivity of Silicon Bars Using a Two-Point Probe", Designation F 397-02, 11 pgs, available befor Jul. 27, 2018.
ASTM International: "Test Methods for Conductivity Type of Extrinsic Semiconducting Materials", Edition SEMI MF-42-1105, 2005, 9 pgs.

* cited by examiner

METHODS FOR MODELING THE IMPURITY CONCENTRATION OF A SINGLE CRYSTAL SILICON INGOT

FIELD OF THE DISCLOSURE

The field of the disclosure relates to methods for forming single crystal silicon ingots in which plural sample rods are grown from the melt. A parameter related to the impurity concentration(s) of the melt or ingot is measured. In some embodiments, the sample rods each have a diameter less than the diameter of the product ingot.

BACKGROUND

Single crystal silicon, which is the starting material for most processes for the fabrication of semiconductor electronic components, is commonly prepared by the so-called Czochralski (CZ) process wherein a single seed crystal is immersed into molten silicon and then grown by slow extraction. Molten silicon is contaminated with various impurities, among which is mainly oxygen, during the time it is contained in a quartz crucible. Some applications, such as advanced wireless communication applications, insulated gate bipolar transistors (IGBT) and low power, low leakage devices, require wafers with a relatively high resistivity such as 1500 ohm-cm (Ω-cm) or more.

Highly pure polysilicon is used for high resistivity ingot production. Highly pure polysilicon may be contaminated with impurities from the crucible, the hot-zone configuration, and/or the process gas circulated throughout the ingot puller. These impurities may change over the length of the run which complicates production of high resistivity ingots and reduces the portion of the ingots with a minimum target resistivity (e.g., reduces the "prime" portion of the ingot).

A need exists for methods for preparing high resistivity silicon ingots that allow the impurity concentration(s) or resistivity of the polysilicon starting material to be sampled over time relatively quickly and/or that allow the impurities to be measured relatively quickly with a relatively small amount of silicon being consumed.

This section is intended to introduce the reader to various aspects of art that may be related to various aspects of the disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

SUMMARY

One aspect of the present disclosure is directed to a method for producing a single crystal silicon ingot from a silicon melt held within a crucible. Polycrystalline silicon is added to the crucible. Polycrystalline silicon is heated to cause a silicon melt to form in the crucible. A first sample rod is pulled from the melt. The first sample rod has a first sample rod diameter. A first sample rod parameter related to the quality of the first sample rod and/or the silicon melt is measured. A second sample rod is pulled from the melt. The second sample rod has a second sample rod diameter. A second sample rod parameter related to the quality of the second sample rod and/or the silicon melt is measured. A product ingot is pulled from the melt. The product ingot has a diameter. The first sample rod diameter and the second sample rod diameter are less than the diameter of the product ingot.

Another aspect of the present disclosure is directed to a method for modeling the impurity concentration of a single crystal silicon ingot. A first sample rod is pulled from a silicon melt disposed in a crucible. The first sample rod has a first sample rod diameter of less than 100 mm. A first sample rod parameter related to the impurity content of the first sample rod is measured. A second sample rod is pulled from the silicon melt. The second sample rod has a first sample rod diameter of less than 100 mm. A second sample rod parameter related to the impurity content of the second sample rod is measured. The impurity concentration of a single crystal silicon ingot is determined based at least in part on the measured first sample rod parameter and the measured second sample rod parameter.

Various refinements exist of the features noted in relation to the above-mentioned aspects of the present disclosure. Further features may also be incorporated in the above-mentioned aspects of the present disclosure as well. These refinements and additional features may exist individually or in any combination. For instance, various features discussed below in relation to any of the illustrated embodiments of the present disclosure may be incorporated into any of the above-described aspects of the present disclosure, alone or in any combination.

BRIEF DESCRIPTION OF THE DRAWINGS

Corresponding reference characters indicate corresponding parts throughout the drawings.

DETAILED DESCRIPTION

Provisions of the present disclosure are directed to methods for producing a single crystal silicon ingot by the Czochralski method in which plural sample rods are grown to determine one or more parameters related to the impurity of the melt (e.g., impurities added through dissolution of the crucible) over time. In some embodiments, the parameters are used to predict the impurity of a subsequently grown product ingot. The sample rods have a diameter less than the product ingot (e.g., a diameter of less than about 150 mm, less than about 100 mm, less than about 50 mm, or less than about 25 mm).

Figure 1:
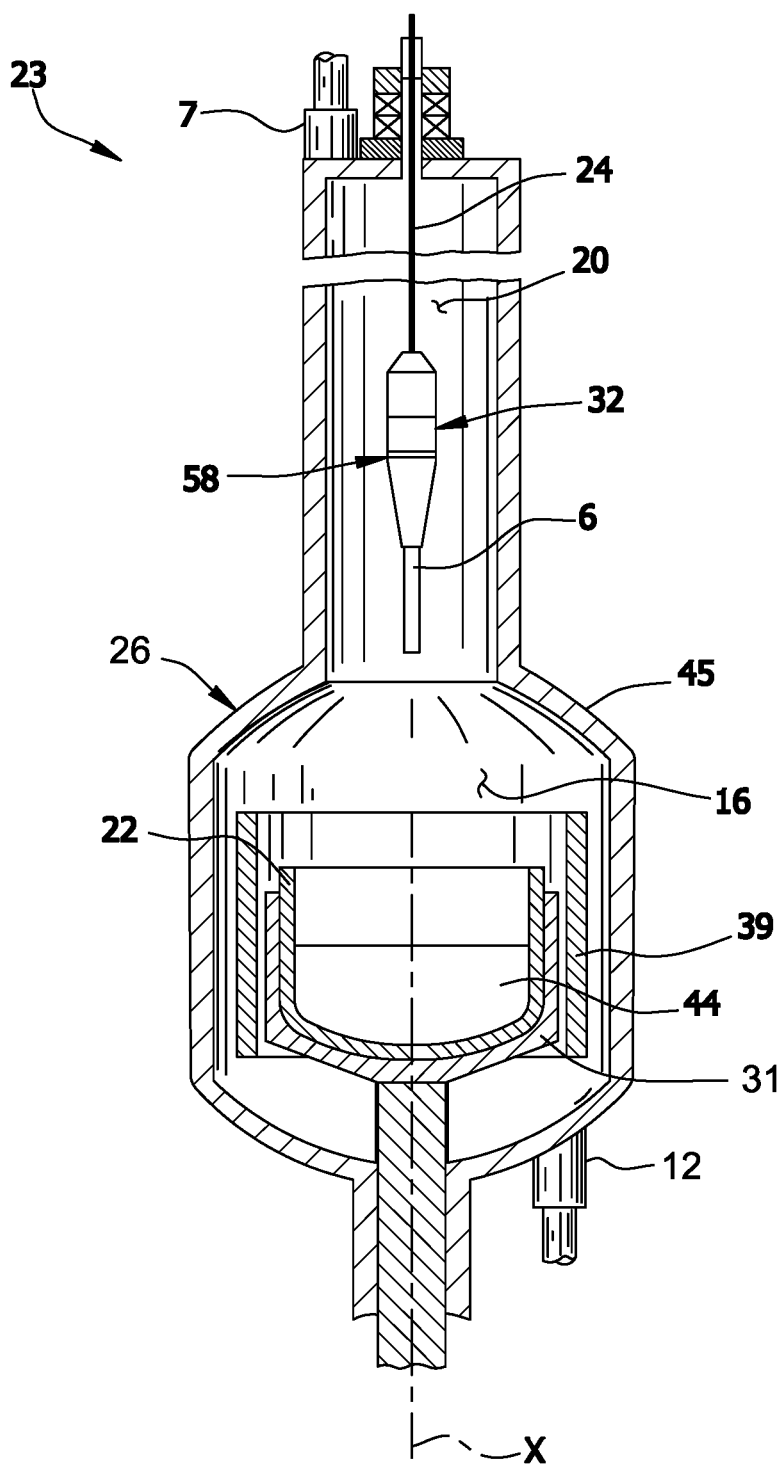
FIG. 1 is a schematic side view of a pulling apparatus for forming a single crystal silicon ingot.

In accordance with embodiments of the present disclosure and with reference to FIG. 1, the product ingot is grown by the so-called Czochralski process in which the ingot is withdrawn from a silicon melt 44 held within a crucible 22 of an ingot puller 23. The ingot puller 23 includes a housing 26 that defines a crystal growth chamber 16 and a pull chamber 20 having a smaller transverse dimension than the growth chamber. The growth chamber 16 has a generally dome shaped upper wall 45 transitioning from the growth chamber 16 to the narrowed pull chamber 20. The ingot puller 23 includes an inlet port 7 and an outlet port 12 which may be used to introduce and remove a process gas to and from the housing 26 during crystal growth.

The crucible 22 within the ingot puller 23 contains the silicon melt 44 from which a silicon ingot is drawn. The silicon melt 44 is obtained by melting polycrystalline silicon charged to the crucible 22. The crucible 22 is mounted on a turntable 31 for rotation of the crucible 22 about a central longitudinal axis X of the ingot puller 23.

A heating system 39 (e.g., an electrical resistance heater) surrounds the crucible 22 for melting the silicon charge to produce the melt 44. The heating system 39 may also extend below the crucible as shown in U.S. Pat. No. 8,317,919. The heating system 39 is controlled by a control system (not shown) so that the temperature of the melt 44 is precisely controlled throughout the pulling process. Insulation (not shown) surrounding the heating system 39 may reduce the amount of heat lost through the housing 26. The ingot puller 23 may also include a heat shield assembly (not shown) above the melt surface for shielding the ingot from the heat of the crucible 22 to increase the axial temperature gradient at the solid-melt interface.

A pulling mechanism (not shown) is attached to a pull wire 24 that extends down from the mechanism. The mechanism is capable of raising and lowering the pull wire 24. The ingot puller 23 may have a pull shaft rather than a wire, depending upon the type of puller. The pull wire 24 terminates in a pulling assembly 58 that includes a seed crystal chuck 32 which holds a seed crystal 6 used to grow the silicon ingot. In growing the ingot, the pulling mechanism lowers the seed crystal 6 until it contacts the surface of the silicon melt 44. Once the seed crystal 6 begins to melt, the pulling mechanism slowly raises the seed crystal up through the growth chamber 16 and pull chamber 20 to grow the monocrystalline ingot. The speed at which the pulling mechanism rotates the seed crystal 6 and the speed at which the pulling mechanism raises the seed crystal (i.e., the pull rate v) are controlled by the control system.

A process gas is introduced through the inlet port 7 into the housing 26 and is withdrawn from the outlet port 12. The process gas creates an atmosphere within the housing 26 and the melt and atmosphere form a melt-gas interface. The outlet port 12 is in fluid communication with an exhaust system (not shown) of the ingot puller.

In this regard, the ingot puller 23 shown in FIG. 1 and described herein is exemplary and other crystal puller configurations and arrangements may be used to pull a single crystal silicon ingot from a melt unless stated otherwise.

Figure 2:
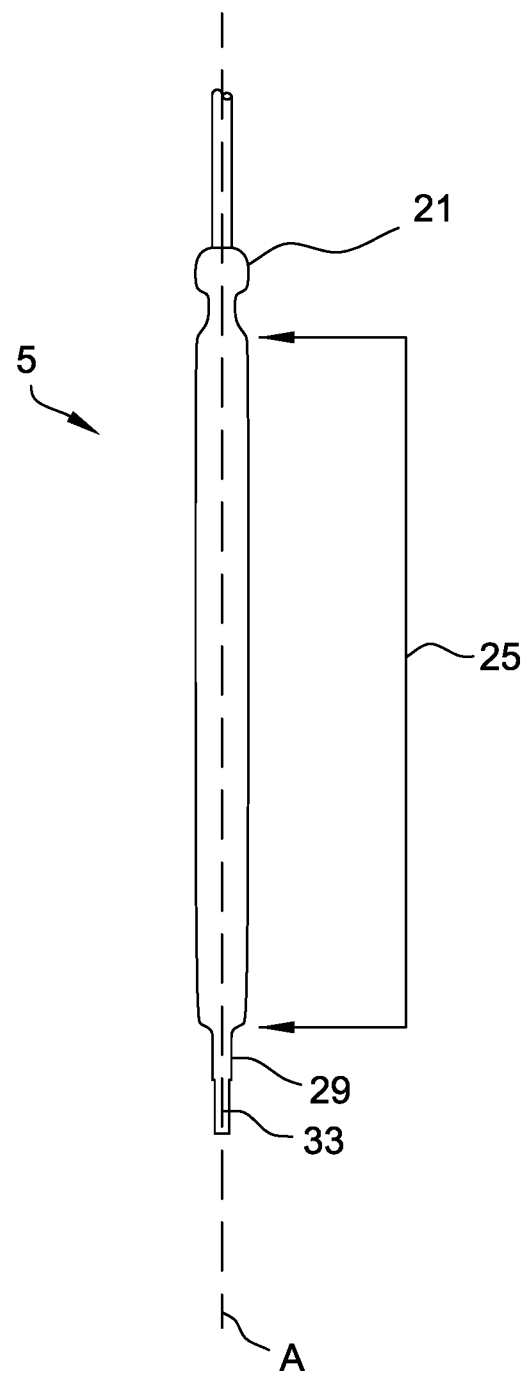
FIG. 2 is a sample rod grown from a silicon melt.

In accordance with embodiments of the present disclosure, after polycrystalline silicon is added to the crucible 22 and the heating system 39 is operated to melt-down the polycrystalline silicon, plural sample ingots or rods are pulled from the melt. Generally, the plural sample rods have a diameter smaller than the subsequently grown product ingot (e.g., less than about 150 mm, less than about 100 mm, less than about 50 mm, less than about 25 mm). An example sample rod 5 is shown in FIG. 2. The rod 5 includes a crown 21 in which the rod transitions and tapers outward from the seed to reach a target diameter. The rod 5 includes a constant diameter portion 25 or cylindrical main body or simply "body", of the crystal which is grown by increasing the pull rate. The main body 25 of the sample rod 5 has a relatively constant diameter. The rod 5 includes a tail or end-cone 29 in which the rod tapers in diameter after the main body 25. When the diameter becomes small enough, the rod is then separated from the melt. The rod 5 has a central longitudinal axis A that extends through the crown 21 and a terminal end 33 of the ingot.

After the first sample rod is pulled from the melt, a first sample rod parameter related to the quality of the first sample rod and/or the silicon melt is measured. The measured parameter may be related to the impurity make-up of the rod such as the phosphorous concentration, boron concentration, total impurity concentration, resistivity of the sample rod, or other impurity concentration (e.g., aluminum, gallium, arsenic, indium, antimony, and the like).

In accordance with embodiments of the present disclosure, a second sample rod is pulled from the melt after the first rod is produced. The second sample rod may have the same diameter and/or length as the first rod or different diameters and/or lengths of rods may be produced. A second sample rod parameter related to the quality of the second sample rod and/or silicon melt is measured (e.g., parameter related to the impurity). The first sample rod parameter and the second sample rod parameter may be the same parameter or, as in other embodiments, may be different parameters (e.g., the impurity content of the first rod is measured and the resistivity of the second rod is measured).

The growth conditions of the first and second sample rods may be selected from generally any of the suitable growth conditions available to those of skill in the art. The sample rod may be grown with a locked seed lift (i.e., fixed pull speed with varying diameter such as +/−about 5 mm) or active seed lift (pull speed varied to maintain target diameter).

In some embodiments, polycrystalline silicon is not added to the crucible after the first sample rod is grown and before the second sample rod is grown and/or before the product ingot is subsequently grown. Alternatively or in addition, in some embodiments the product ingot (e.g., an ingot having a diameter larger than the sample rod such as a 200 mm, 300 mm, 450 mm diameter ingot) is not grown between growth of the first sample rod and the second sample rod.

In some embodiments, the diameter of both the first and second sample rod is less than about 150 mm or less than about 100 mm, less than about 50 mm, less than about 25 mm, or less than about 20 mm (e.g., from about 5 mm to about 150 mm, from about 5 mm to about 100 mm, from about 5 mm to about 50 mm, from about 5 mm to about 25 mm or from about 10 mm to about 25 mm). Generally, the diameter of the rod 5 is measured by measuring the rod along several axial locations (e.g., within a constant diameter portion of the rod if the rod has a crown and/or tapered end) and averaging the measured diameters (e.g., measuring 2, 4, 6, 10 or more diameters across the length and averaging). In some embodiments, the largest diameter of the sample of the rod is less than about 150 mm or less than about 100 mm, less than about 50 mm, less than about 25 mm, or less than about 20 mm (e.g., from about 5 mm to about 150 mm, from about 5 mm to about 100 mm, from about 5 mm to about 50 mm, from about 5 mm to about 25 mm or from about 10 mm to about 25 mm).

The sample rod 5 may have any suitable length. In some embodiments, the rod (e.g., after cropping) has a length of less than about 300 mm, less than about 200 mm or less than about 100 mm (e.g., about 25 mm to about 300 mm).

In some embodiments, the first and/or second sample rod parameter that is related to the quality of the sample rod and/or silicon melt may be a parameter related to the impurity of the melt. For example, the boron concentration, the phosphorous concentration, the total impurity concentration or the resistivity of the sample rod(s) may be measured.

In some embodiments, the impurity concentration is measured by Fourier-transform infrared spectroscopy (e.g., low temperate FTIR) or by photoluminescence. Such methods allow relatively low impurity concentrations to be measured such as impurities typical of high or ultra-high resistivity applications (e.g., a concentration of impurities of less than $1 \times 10^{12}$ atoms/cm$^3$). The methods may involve overall net carrier concentration determination (i.e., resistivity) or concentrations of particular impurities (e.g., boron or phosphorous).

In some embodiments, the resistivity of the first and/or second sample rods is measured. The rod 5 is removed from the ingot puller 23 and is processed to allow the resistivity to be measured. The crown and tail of the ingot may be removed, such as by use of a wire saw. In some embodiments, the cropped ends of the rod 5 are ground to flatten the ends. The rod ends may be etched (e.g., mixed acid etched). The rod 5 may be modified to include ohmic contacts such as ohmic contacts at its first and second ends 15, 17. For example, the cut ends 15, 17 of the rod 5 may be painted with a colloidal silver paint and dried.

Figure 3:
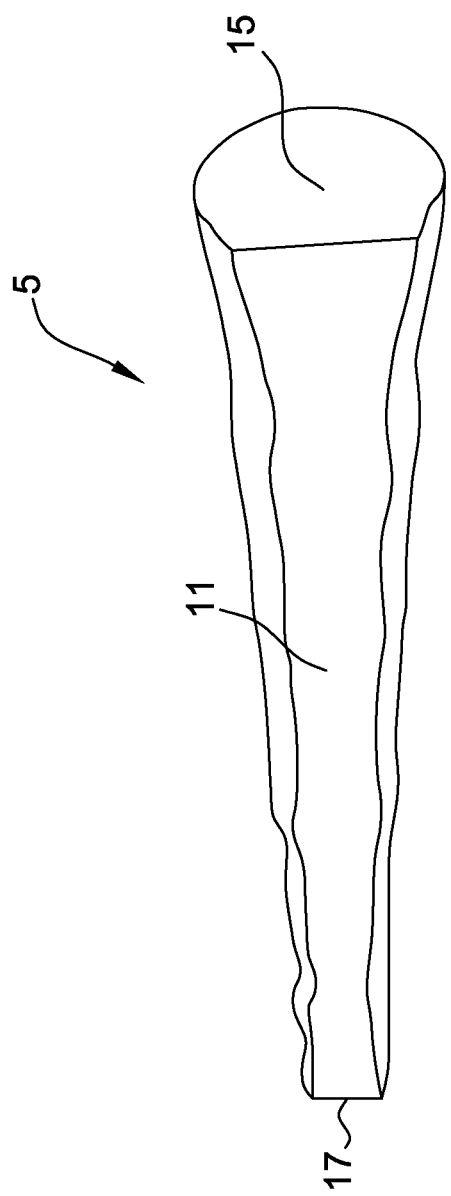
FIG. 3 is the sample rod with a planar segment formed on its surface.

A planar segment 11 (FIG. 3) is formed on a surface of the rod 5. The planar segment 11 may extend axially along the rod 5. In some embodiments, the planar segment 11 extends axially from the first end 15 to the second end 17 of the rod 5. In other embodiments, the planar segment 11 extends only partially along its length.

The planar segment 11 may be formed by grinding a surface of the sample rod 5 such as by use of a grinding pad (e.g., diamond grit pad). In some embodiments, the planar segment has a width sufficient to allow contact with a voltage probe (e.g., about 2-4 mm). The planar segment 11 may be cleaned such as by washing with deionized water and drying before resistivity measurement.

In some embodiments, the sample rod 5 is subjected to a rapid thermal anneal before measuring the resistivity. The rapid thermal anneal may act as a thermal donor kill cycle (i.e., annihilation of thermal donors) by dissociating interstitial oxygen clusters. In some embodiments, the anneal is at a temperature of about 500° C. or more, about 650° C. or more or about 800° C. or more (e.g., 500° C. to about 1000° C., from about 500° C. to about 900° C. or from about 650° C. to about 1100° C.) for at least about 5 seconds, at least about 30 seconds, at least about 1 minute or at least about 3 minutes or more (e.g., from about 5 seconds to 15 minutes, from about 5 seconds to about 5 minutes or from about 5 seconds to about 3 minutes).

The resistivity of the rod 5 may be measured from the planar segment 11. In some embodiments of the present disclosure, current is driven through the rod 5 and a resistivity probe is contacted at one or more locations along the length of rod 5. Current may be applied to the rod 5 through one of the ends 15, 17.

Figure 4:
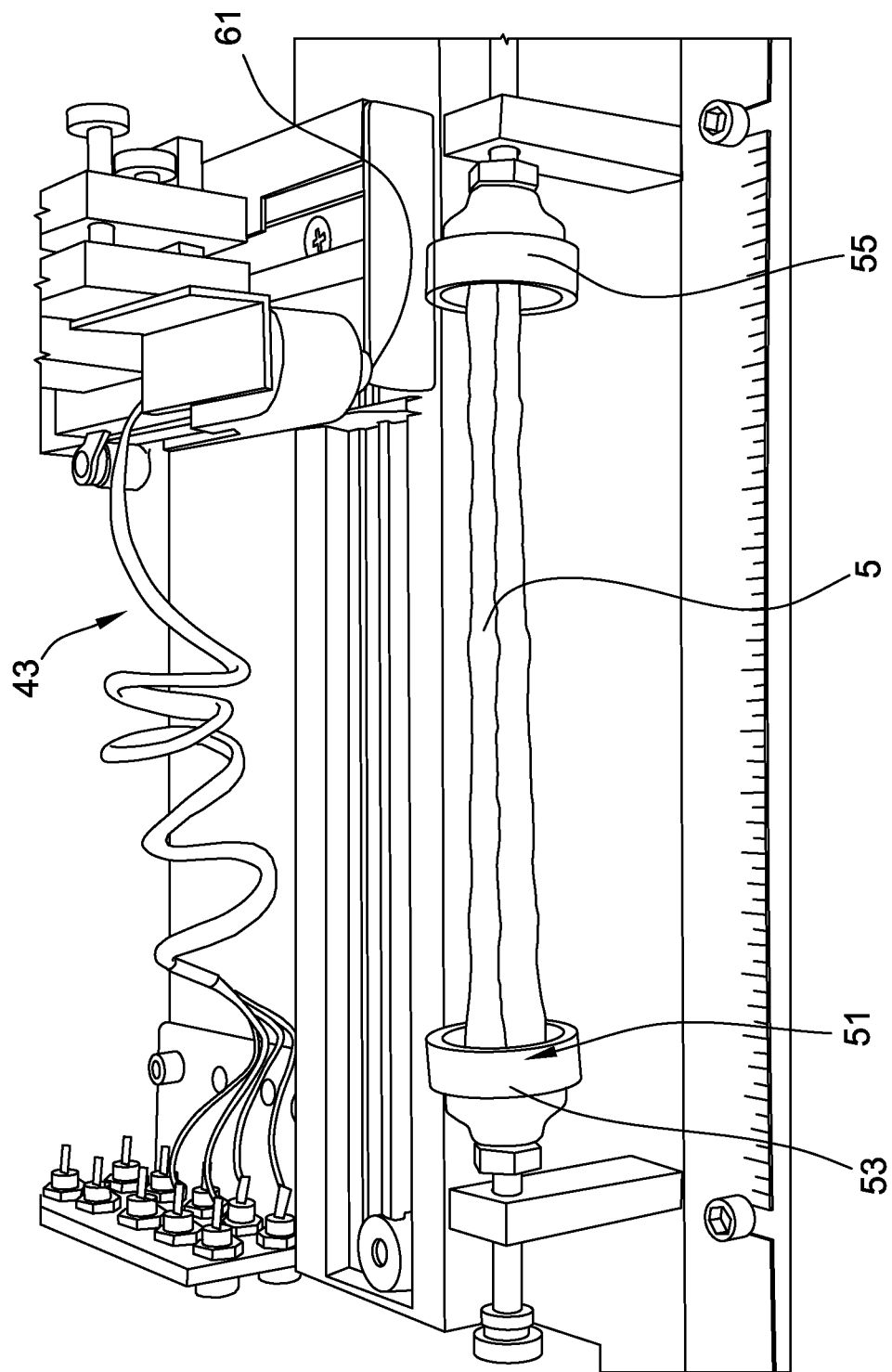
FIG. 4 is a measurement apparatus for measuring the resistivity of the sample rod.

In some embodiments, the rod 5 is secured within a measurement apparatus such as the apparatus 43 shown in FIG. 4. The measurement apparatus 43 includes a clamp 51 that secures the rod 5. The clamp 51 has a first support 53 that secures the rod 5 toward its first end 15 and a second support 55 that secures the rod 5 toward its second end 17. The supports 53, 55 are configured to hold the rod (e.g., threaded for adjustment and clamping). The supports 53, 55 may contact ohmic contacts on the cropped ends of the rod 5. A probe tip 61 is caused to contact the rod 5 on the flat planar segment of the rod. Current is passed through the supports 53, 55 and the voltage is measured by the probe tip 61. The probe tip 61 is moved manually down the axis of the neck 5 with current applied/voltage being measured at each point. In the illustrated apparatus 43 the probe tip 61 is moved manually. In other embodiments, the probe tip 61 is moved by actuators.

The measurement apparatus 43 of FIG. 4 is an example apparatus and any suitable apparatus for securing and/or measuring the resistivity of the rod may be used unless stated otherwise. Use of a rod (e.g., generally a narrow diameter rod such as less than 100 mm, 50 mm or less than 25 mm) and the measurement apparatus 43 allows the resistivity to be measured without slicing the rod into wafers or slugs.

The resistivity probe may be a two point probe in which both probe tips are contacted with the planar segment 11. The voltage difference is measured across the two probe tips. For example, resistivity may be measured with a two-point probe in accordance with SEMI Standard MF397-0812, entitled "Test Method for Resistivity of Silicon Bars using a Two-Point Probe," which is incorporated herein by reference for all relevant and consistent purposes. The 2-terminal or 3-terminal rectification method may be used to determine the crystal type (i.e., N-type or P-type). Such type determination may be performed in accordance with SEMI Standard MF42-0316, entitled "Test Method for Conductivity Type of Extrinsic Semiconducting Materials", which is incorporated herein by reference for all relevant and consistent purposes. Both 2-terminal and 3-terminal rectification methods are robust methods for very high resistivity silicon.

The voltage may be measured at various points across the length. The measured voltages and the sample length and average diameter may be used to calculate the resistivity such as by determining the slope of a current-voltage curve (e.g., Example 1 below).

After the first and second sample rods are analyzed (e.g., a parameter such as impurity concentration or resistivity is measured), the measured parameter of the first sample rod and the second sample rod may be compared. The difference in the parameters provides time-dependent information regarding the quality of the melt. For example, the rate of at which the parameter changes may be measured (e.g., change in impurity concentration or resistivity over time).

Additional sample ingots may be grown to provide further time-related information relating to the growth conditions (e.g., impurities of the melt). In some embodiments, a third, fourth, fifth, sixth, seventh, eighth, ninth and/or even tenth sample rod is pulled from the melt (e.g., with the diameter of each rod being less than about 150 mm, less than about 100 mm, less than about 50 mm, less than about 25 mm, or less than about 20 mm). A sample rod parameter related to the impurity content for each sample rod pulled from the melt may be measured.

In some embodiments, the first and second sample rods (and, optionally, each subsequent rod) has a relatively low oxygen content such as an oxygen content of less than about 5.5 ppma. In other embodiments, the oxygen content of each sample rod is less than 5.2 ppma, less than 5.0 ppma, less than 3.5 ppma, less than about 3 ppma or even less than about 2.5 ppma. In some embodiments, the sample rod 5 is free of dislocations.

In some embodiments, a product ingot is grown from the melt after the sample rods are grown. The diameter of the first sample rod and the diameter of the second sample rod are less than the diameter of the product ingot. For example, the diameter of the sample rods may be less than 0.75 times the diameter of the product ingot, less than 0.50 times, less than about 0.25 times or less than 0.1 times the diameter of the product ingot.

In some embodiments, the rod 5 has a diameter that generally corresponds to the diameter of the neck portion of a product ingot grown in the crystal puller. For example, the rod may have a diameter of less than 50 mm, less than 25 mm, or less than 20 mm.

In some embodiments, polycrystalline silicon is not added during the growth of the product ingot (e.g., as in a batch process). Additional sample rods may be grown after the product ingot is grown and the crucible is recharged with polycrystalline silicon. In other embodiments, polycrystalline silicon is added to the melt as the product ingot is grown (e.g., as in a continuous Czochralski method).

The measured first sample rod parameter and the measured second sample rod parameter may be used to adjust the growth conditions of the product ingot and/or of one or more subsequently grown product ingots pulled from other melts (e.g., a second melt formed in the crucible after the first product ingot is grown). For example, the growth conditions of the product ingot may be altered based at least in part on the measured first sample rod parameter and/or the second sample rod parameter. Example growth conditions include the hot-zone configuration, side heater power, heater geometry, crucible liner thickness, dopant concentration, impurity and dopant evaporation, gas flow rate, and/or chamber pressure. In some embodiments, the first sample rod parameter and/or the second sample rod parameter is correlated to crucible dissolution (e.g., impurity input during crucible dissolution), hot zone contamination or gas flow impurity.

In some embodiments, a parameter related to the impurity content of a single crystal silicon ingot (e.g., the product ingot pulled from the same melt as the sample rods or a product ingot pulled from a second melt) is determined (e.g., modeled), at least in part, from the first and second sample rod parameters. For example, the impurity concentration or resistivity of the product ingot is determined from, at least in part, a rate of change in the difference between first sample rod parameter and the second sample rod parameter. Alternatively or in addition, the parameter related to the impurity of the product ingot may be determined from a model with the first sample rod parameter and the second sample rod parameter being input into the model. Generally, any model available to those of skill in the art to predict the impurities of a product ingot may be used such as models that use time-dependent changes in the impurities of the melt.

In some embodiments, the measured first sample rod parameter and the measured second sample rod parameter are used to adjust the amount of dopant added to the polycrystalline silicon melt. An amount of dopant may be added to the melt before growing the first sample rod and an amount of dopant (e.g., the same dopant or a different dopant) is added after the first sample rod is grown and before the second sample rod is grown. In some embodiments, an amount of dopant is added after the second sample rod is grown and before the product ingot is grown. In other embodiments, dopant is not added before growth of either the first and second sample rods.

The polysilicon from which the first and second sample rods and product ingot are pulled may be semiconductor grade polysilicon. When semiconductor grade polysilicon is used, in some embodiments the polysilicon has a resistivity greater than 4,000 Ω-cm and contains no more than 0.02 ppba boron or phosphorous.

After the sample rod is pulled and, optionally, dopant is added to the melt, a product ingot is withdrawn from the melt. The product ingot has a diameter greater than the diameter of the first and second sample rod (i.e., the diameter of the constant diameter portions of the first and second sample rod is less than the diameter of the constant diameter portion of the ingot). The product ingot may have a diameter of about 150 mm or, as in other embodiments, about 200 mm, about 300 mm or more (e.g., 450 mm or more).

In some embodiments, the melt is relatively pure and/or compensated to achieve a relatively high resistivity product ingot. In some embodiments, the product ingot has a resistivity of at least about 1,500 Ω-cm or, as in other embodiments, at least about 2,000 Ω-cm, at least about 4,000 Ω-cm, at least about 6,000 Ω-cm, at least about 8,000 Ω-cm, at least about 10,000 Ω-cm or from about 1,500 Ω-cm to about 50,000 ohm-cm or from about 8,000 Ω-cm to about 50,000 Ω-cm. Alternatively or in addition, the first and second sample rods may have a resistivity of at least about 1,500 Ω-cm, or at least about 2,000 Ω-cm, at least about 4,000 Ω-cm, at least about 6,000 Ω-cm, at least about 8,000 Ω-cm, at least about 10,000 Ω-cm, from about 1,500 Ω-cm to about 50,000 ohm-cm or from about 8,000 Ω-cm to about 50,000 Ω-cm.

Compared to conventional methods for producing a single crystal silicon ingot, the methods of the present disclosure have several advantages. By growing first and second sample rods and measuring a parameter related to the change in the impurities of the melt (e.g., impurities added through dissolution of the crucible), time-dependent information (e.g., change in impurities) over time may be determined. By growing sample rods with relatively small diameters (e.g., less than about 100 mm, less than about 50 mm or less than about 25 mm compared to a product ingot with a diameter of 200 mm or more), addition of polycrystalline silicon between growth of rods may be eliminated with eliminates changes to the impurities attributed to polycrystalline silicon addition. This allows the impurity contribution effect of crucible dissolution and/or hot zone contamination to be segregated.

The relatively small diameter sample rods consume relatively little amount of the melt (e.g., less than 1 kg, less than 0.5 kg or about 0.25 kg or less compared to a full diameter short ingot which may consume 15 kg, 20 kg or 50 kg or more of the melt) and reduces impurity build-up attributed to the sampling process (e.g., segregation). Multiple sample rods may be produced with a negligible change to the melt depth within the crucible. The sample rod may be grown relatively quickly (e.g., about 12, 10 or even 5 hours or less compared to a full size short ingot which may involve 20 hours, 30 hours, 40 hours, or 50 hours of growth time).

In embodiments in which relatively pure polysilicon is used to produce relatively high resistivity product ingots, use of transform infrared spectroscopy or photoluminescence may allow the impurity content (e.g., boron and/or phosphorous) to be measured.

In embodiments in which the resistivity of the sample rods is measured to determine the impurity concentration and/or resistivity of the melt and/or product ingot, the resistivity may be measured directly from the rod by a four point or two point probe relatively quickly (e.g., 8 hours or less or even 6 hours or less) to provide nearly real time indirect resistivity measurement that may change due to impurity buildup over time.

EXAMPLES

The processes of the present disclosure are further illustrated by the following Examples. These Examples should not be viewed in a limiting sense.

Example 1: Determination of Resistivity from I-V Curve

Figure 5:
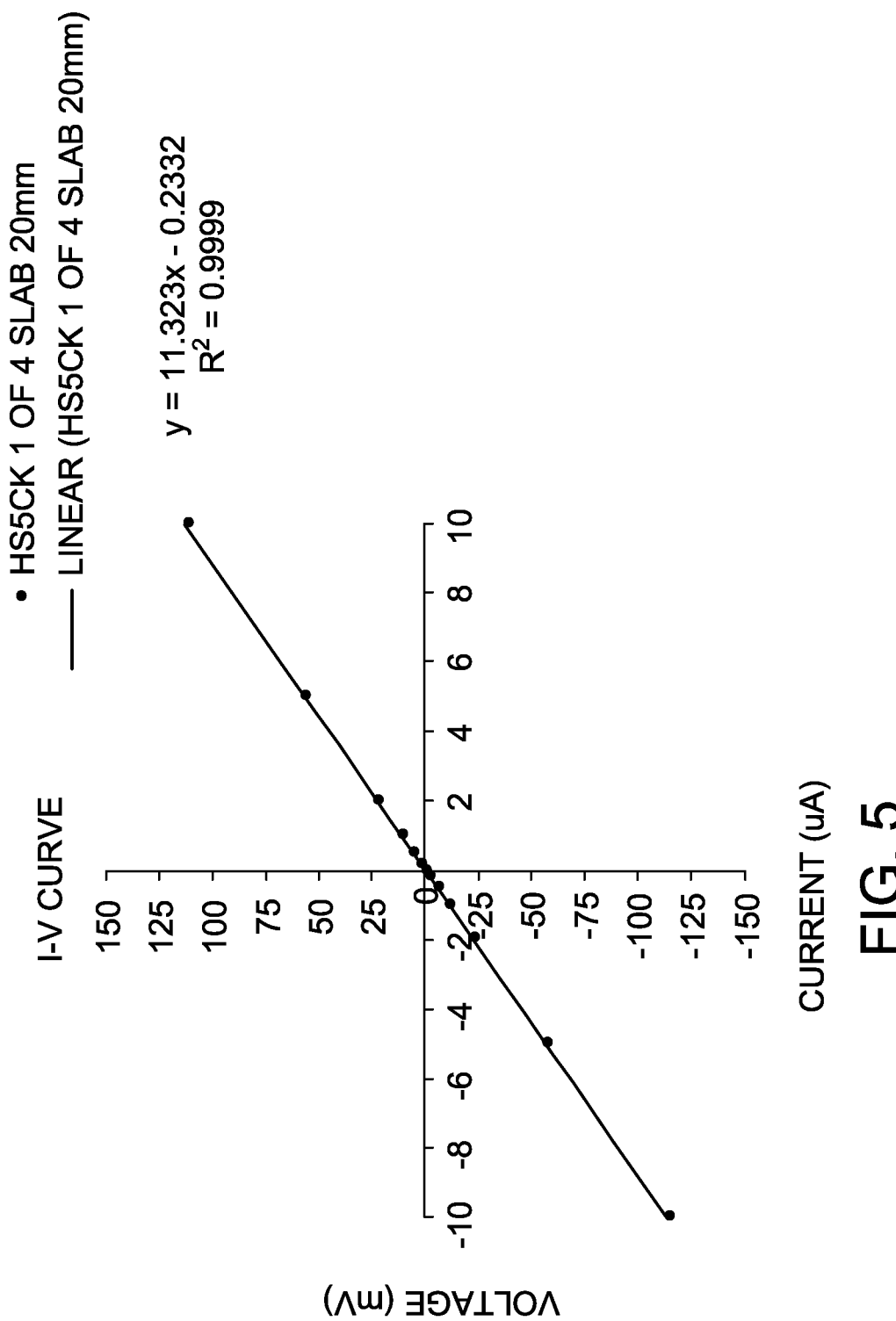
FIG. 5 is an I-V curve used to measure resistivity of a sample rod.

Voltage of a sample rod was measured axially (e.g., such as with the apparatus of FIG. 4) with the applied current and measured voltage being recorded. FIG. 5 shows the I-V curve that was generated. Using the geometry of the sample and the slope of the I-V curve, the resistivity was determined to be 6139 ohm-cm for the sample.

Figure 6:
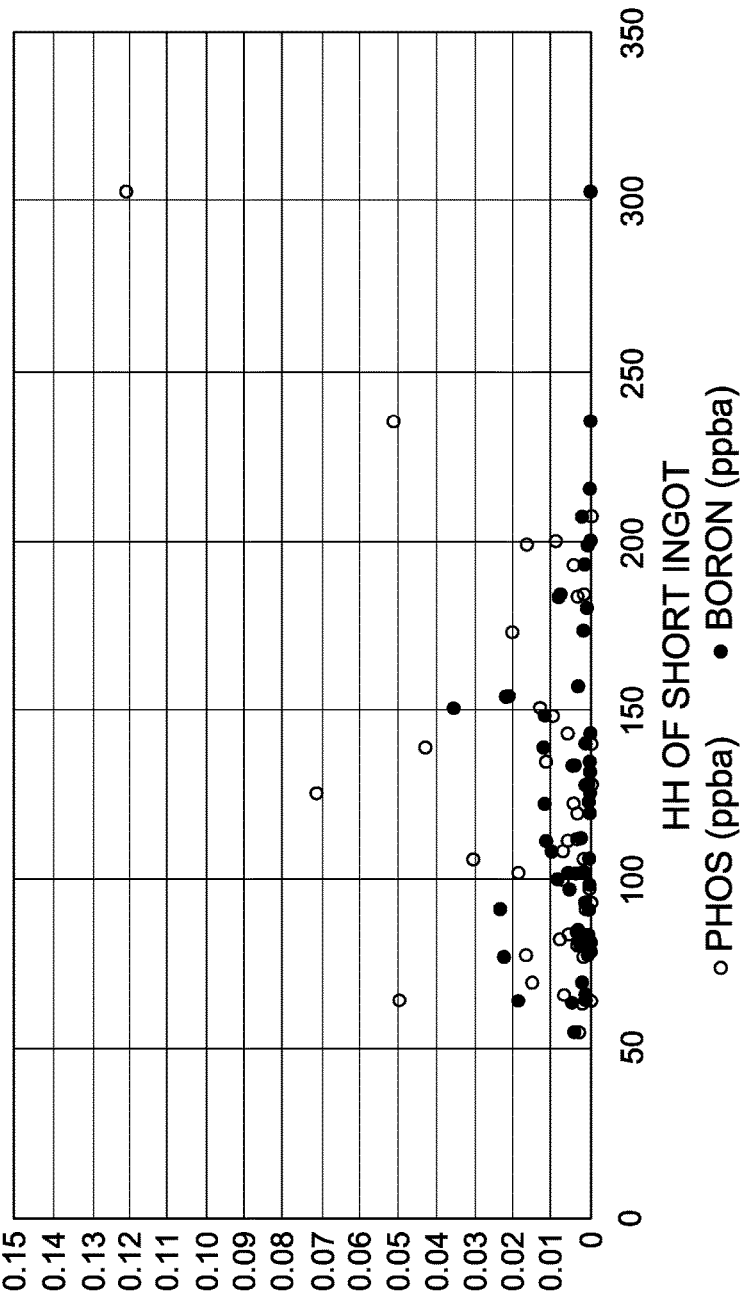
FIG. 6 is a scatter plot of calculated boron/phosphorous content of the silicon melt for a number of short ingots.

Example 2: Estimated Boron and Phosphorous Content in Melt and Dissolved Crucible Wall FIG. 6 shows the calculated phosphorous/boron content of the silicon melt for a number of short ingots produced prior to product ingot production. P/B was calculated based on models for resistivity behavior with the resistivity of the short ingot being measured, a known amount of P/B dopant being added to the melt and the resistivity of the product ingot being measured. With these parameters, the concentration of the starting P/B from the starting polysilicon charge and through crucible dissolution may be calculated.

Of the data points shown in FIG. 6, 10-20% of the data points showed additional P/B content to P/B content of the initial polysilicon charge which indicates that the boron and phosphorous concentration is generally affected by crucible dissolution. Unclear time dependence in FIG. 6 indicates that the contribution of the crucible might be different by lot and process time.

Example 3: Comparison of Short Ingot Vs Sample Rod

A single crystal short sample ingot ("Short Ingot") having a diameter of about the size of the product rod (e.g., about 200 mm in a 200 mm pulling apparatus) was grown in a pulling apparatus similar to FIG. 1. The crystal was cropped and subjected to a mixed acid etch (MAE). The crystal slug was rapid thermal annealed at 800° C. for 3 minutes and lapped. The slug was contacted with a four-point probe to measure the resistivity and averaged over three measurements.

A sample rod ("Sample Rod") was grown in locked seed lift mode in the same pulling apparatus after the short ingot was grown. The diameter of the rod varied across its length and was within a range of 17-23 mm with an average of 20 mm. The sample rod was cropped and ground to form a flat segment that extended from one end to the other end of the rod. The rod was rapid thermal annealed at 800° C. for 3 minutes. The resistivity of the ingot was measured by a measurement apparatus similar to the apparatus shown in FIG. 4 and with a two-point probe. The differences between the growth conditions are shown in Table 1 below:

TABLE 1

Growth Conditions for Sample Ingot 200 mm in Diameter and a Sample Rod ~17-23 mm in Diameter

| | Short Ingot | Sample Rod |
| --- | --- | --- |
| Diameter (mm) | 207 | ~17-23 |
| Weight (kg) | 31 | 0.11 |
| Length (mm) | 250 | 200 |
| Process Time (hr) | 25 | 5 |
| Resistivity Sample Preparation Time | 26 | 6 |
| Total time (hr) | 51 | 11 |

Figure 7:
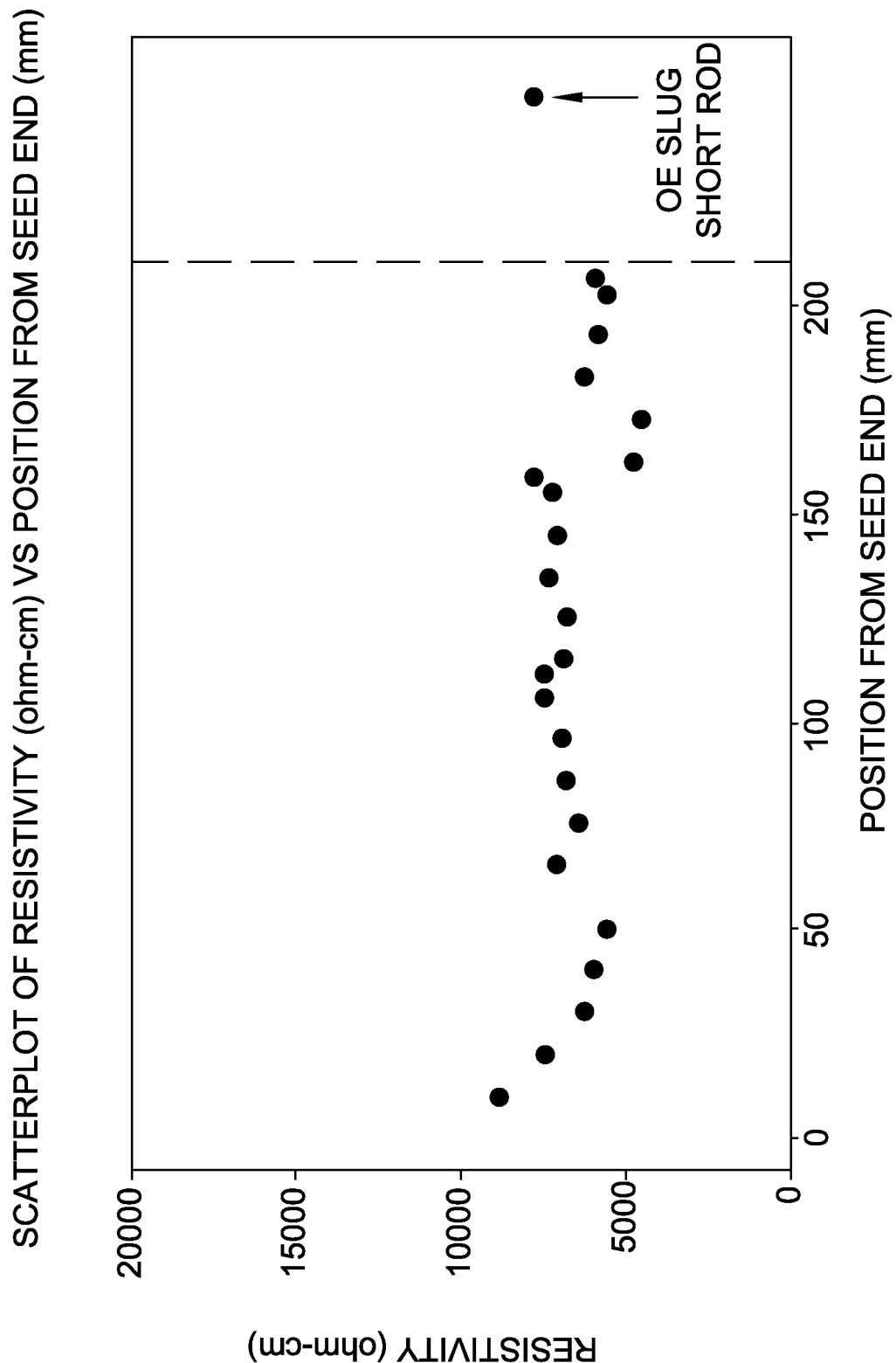
FIG. 7 is a scatter plot of the resistivity of a sample rod at various positions from the seed end.

The measured resistivities across the length of the sample rod and the resistivity of a slug from the sample ingot are shown in FIG. 7.

The sample preparation time for the short ingot was 26 hours and involved cropping, mixed acid etched, rapid thermal anneal, slab cutting, grinding (e.g., with a diamond pad), lapping and measurement with a 4-point probe while sample preparation time for the sample rod was 6 hours and involved cropping, mixed acid etched, rapid thermal anneal, flat grinding (with a diamond pad), lapping and measurement with a 2 point probe.

Example 4: Resistivity Trend in Silicon Melt

A short ingot having the same diameter of the product ingot (200 mm) was grown from a silicon melt (phosphorus-doped for N-type). A sample rod having a diameter of about 17 mm was then grown followed by the product ingot. Resistivity of slugs from the short ingot and the product ingot were measured by a four point probe.

The ends of the sample rod were cut and a planar segment formed on the rod. The resistivity along the planar segment of the sample rod was measured by a two point probe. The resistivity of the slugs and the change in resistivity along the sample rod is shown in FIG. 8.

A short ingot, sample rod and product ingot were grown for a P-doped melt (boron-doped) with the same resistivity measurements being made. The resistivity of the short ingot, the change in resistivity along the sample rod, and the resistivity of the product ingot are shown in FIG. 9.

Figure 10:
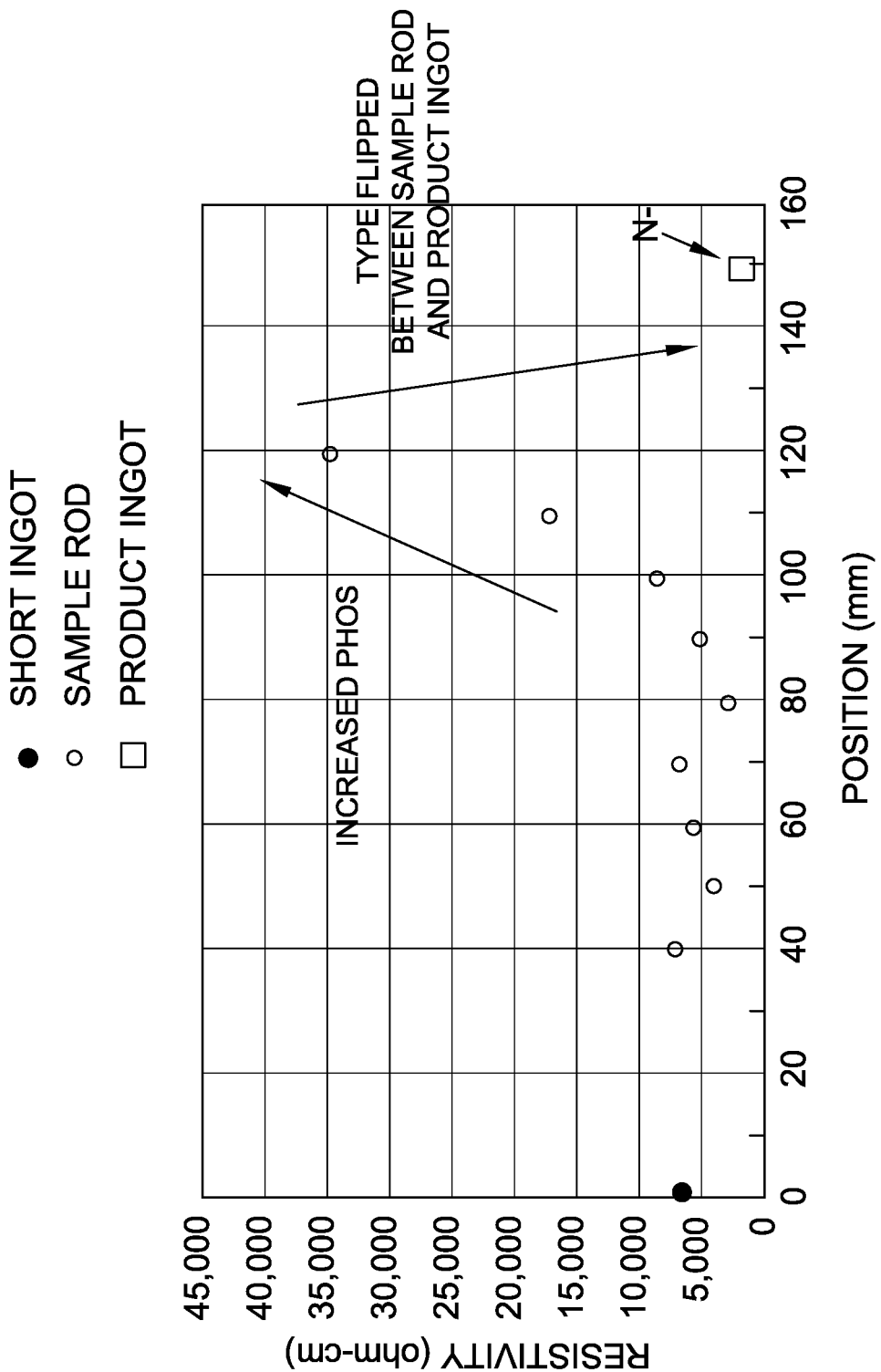
FIG. 10 is a scatter plot of the resistivity of a short ingot, sample rod and product ingot of Example 4 that type-changed from P-type to N-type.

A short ingot, sample rod and product ingot were grown for a second P-doped melt (boron-doped) with the same resistivity measurements being made. The resistivity of the short ingot, the change in resistivity along the sample rod, and the resistivity of the product ingot are shown in FIG. 10. A show in FIG. 10, the crystal type-flipped to N-type between the sample rod and the slug from the product ingot.

Figure 8:
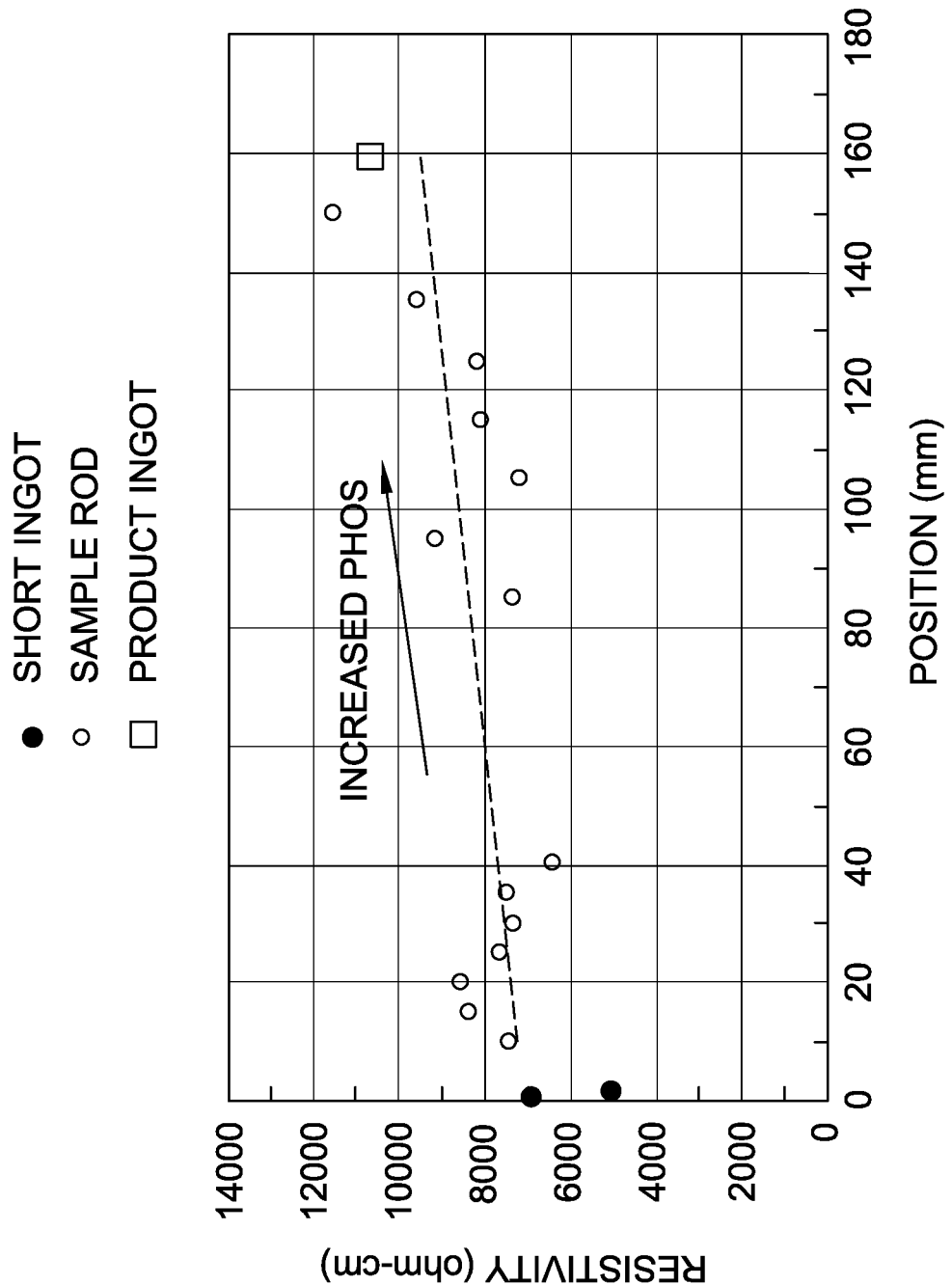
FIG. 8 is a scatter plot of the resistivity of a phosphorous-doped short ingot, sample rod and product ingot of Example 4.
Figure 9:
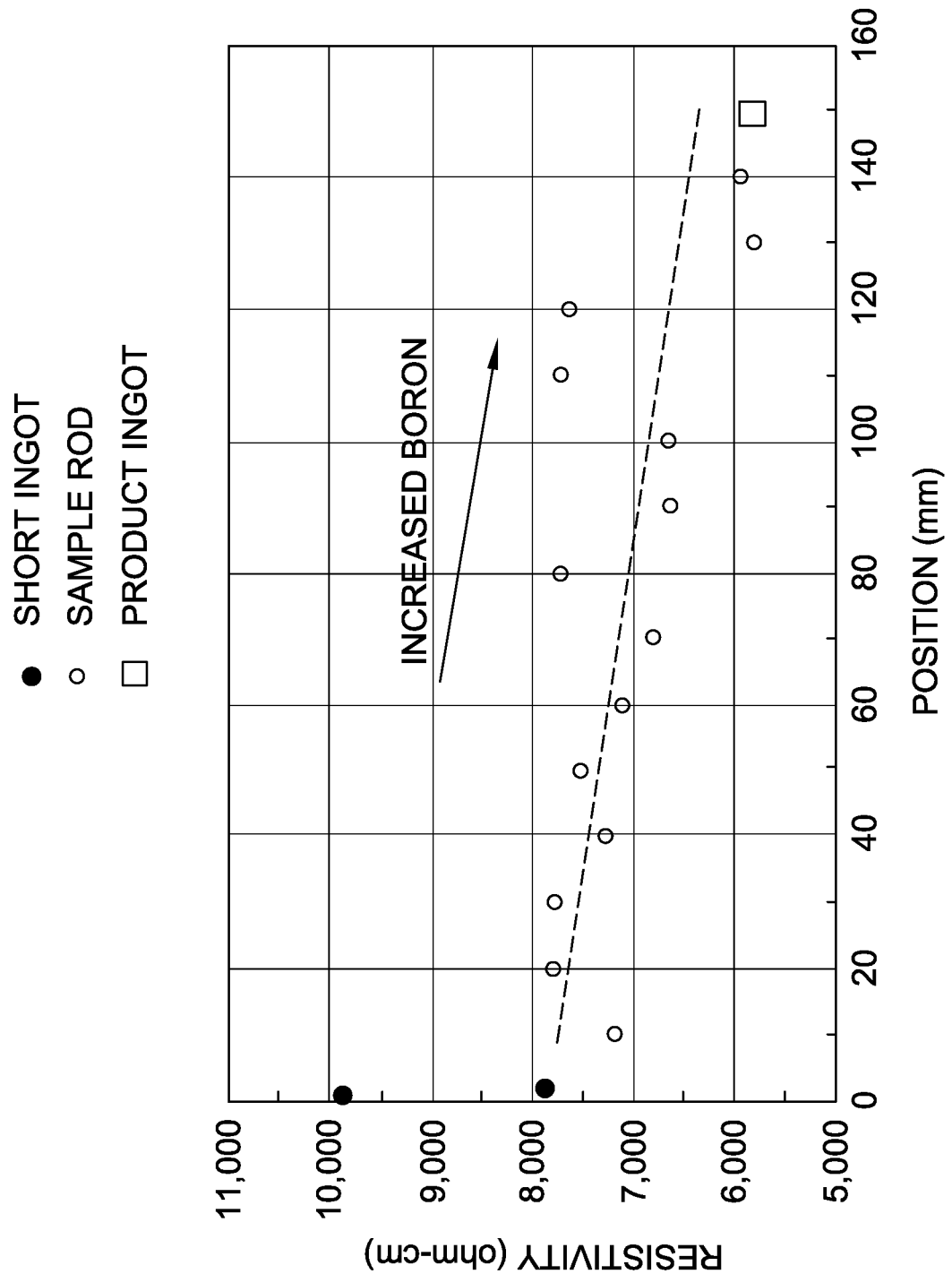
FIG. 9 is a scatter plot of the resistivity of a boron-doped short ingot, sample rod and product ingot of Example 4.

As shown in FIGS. 8-10, the resistivity of the melt is not at steady state over time and the product ingot resistivity is impacted with changing impurity amounts (e.g., from dissolution of the crucible). The resistivity trend of the sample rod matches the resistivity of the product ingot. The change of resistivity of the sample rod varied over time rather than by changes in the g-value because the sample rod was grown with negligible difference in g-value between the ends of the sample rod. Growth of plural sample rods at different time intervals would better enable seed-end resistivity targeting of the product ingot and improved axial resistivity of the product ingot.

Example 5: Build-up of Phosphorous as Shown by Plural Sample Rods

Figure 11:
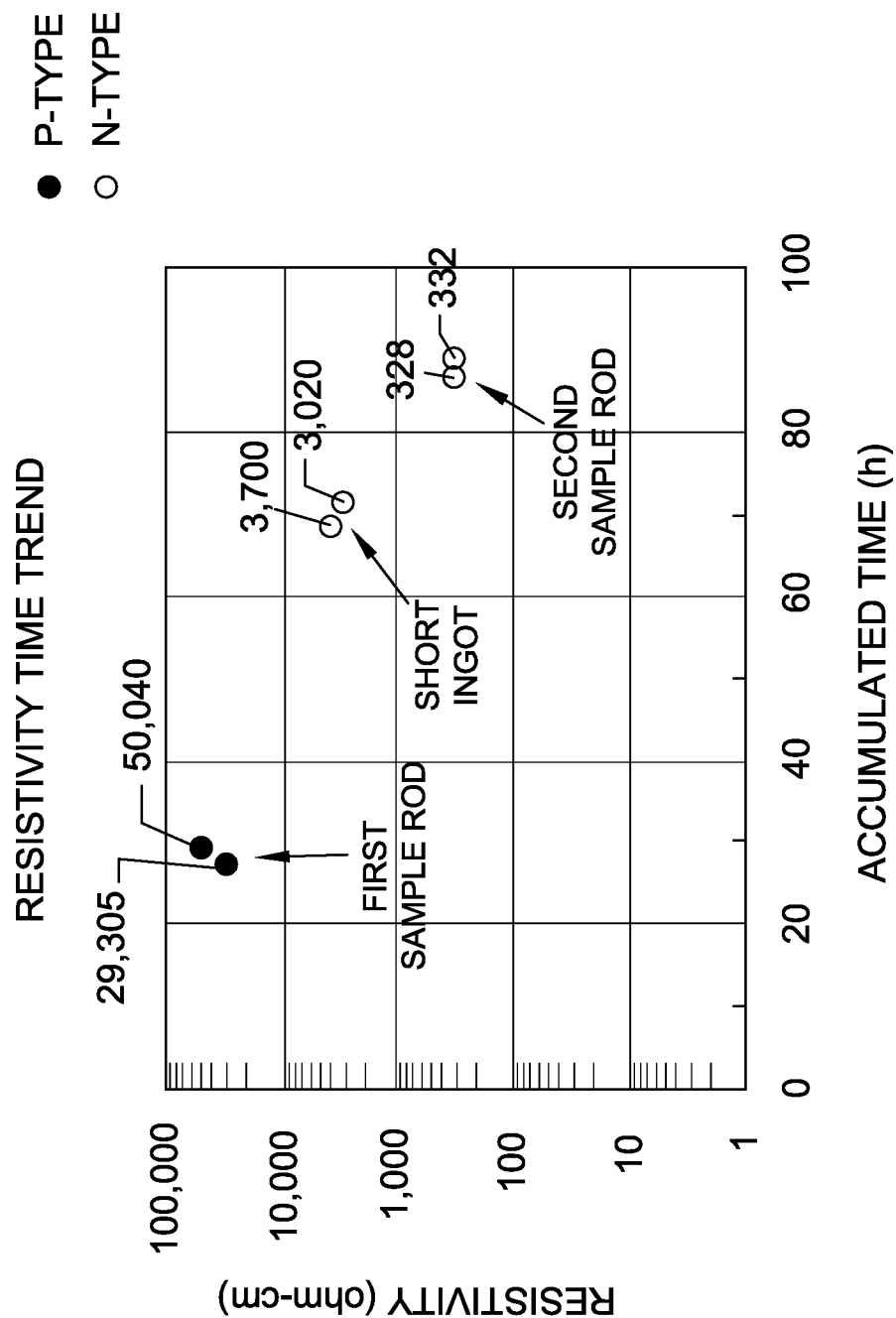
FIG. 11 is a scatter plot of the resistivity of a first sample rod, short ingot, and second sample rod of Example 5.
Figure 12:
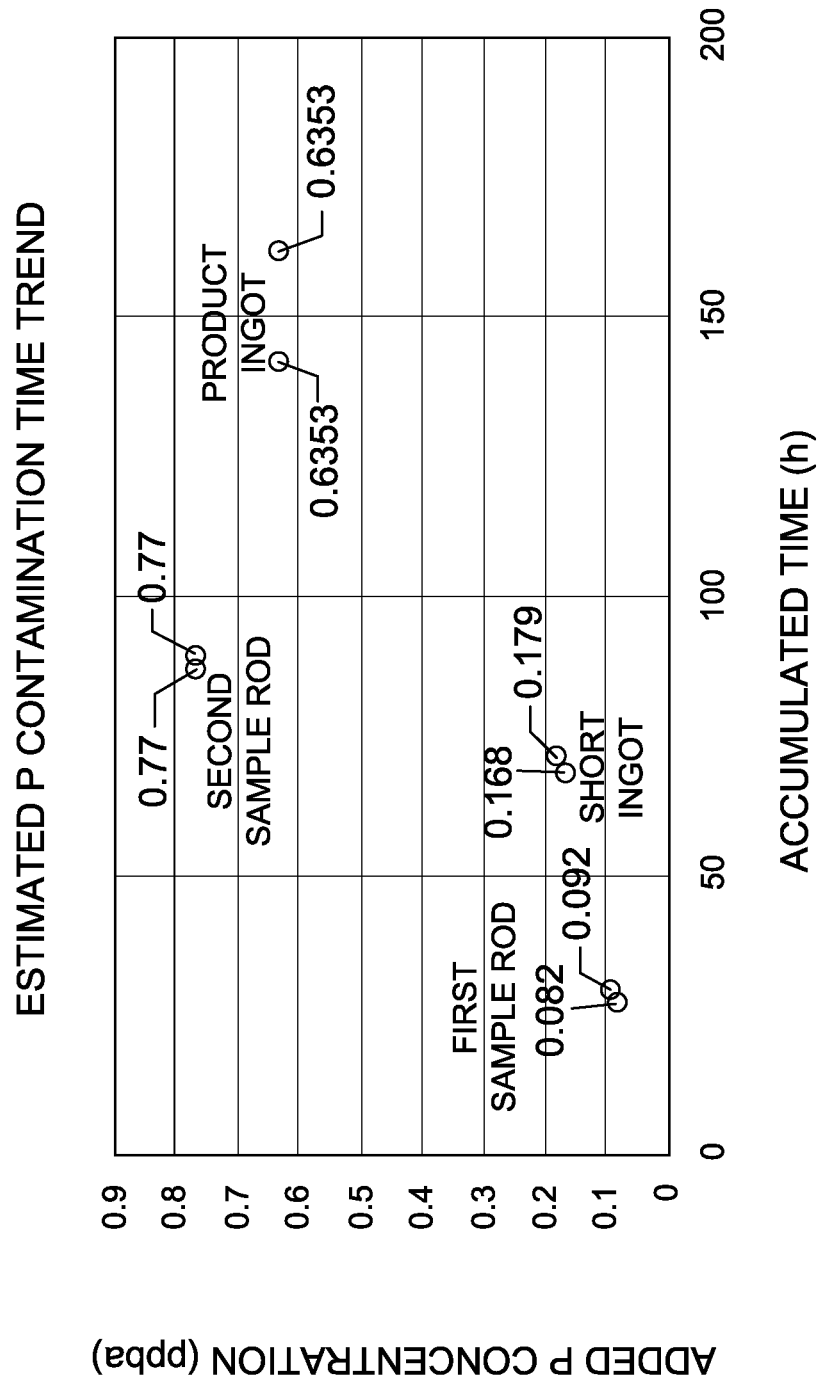
FIG. 12 is the calculated phosphorous contamination time trend based on the resistivity of the first sample rod, short ingot, second sample rod, and product ingot of Example 5.

A boron-doped silicon melt was prepared and plural sample rods and a short ingot were pulled from the melt. A first sample rod (about 17 mm) was grown followed by the short ingot. A second sample rod (about 17 mm) was grown after the short ingot. FIG. 11 shows the resistivity of the sample rods and short ingot. A type change occurred between the initial sample rod and the short ingot. FIG. 12 shows the calculated build-up of phosphorous from each of the first sample rod, short ingot, second sample rod, and product ingot. As shown in FIG. 12, the transient change from the first sample rod to the second sample rod better estimates the phosphorus build-up in the melt over time.

As used herein, the terms "about," "substantially," "essentially" and "approximately" when used in conjunction with ranges of dimensions, concentrations, temperatures or other physical or chemical properties or characteristics is meant to cover variations that may exist in the upper and/or lower limits of the ranges of the properties or characteristics, including, for example, variations resulting from rounding, measurement methodology or other statistical variation.

When introducing elements of the present disclosure or the embodiment(s) thereof, the articles "a", "an", "the" and "said" are intended to mean that there are one or more of the elements. The terms "comprising," "including," "containing" and "having" are intended to be inclusive and mean that there may be additional elements other than the listed elements. The use of terms indicating a particular orientation (e.g., "top", "bottom", "side", etc.) is for convenience of description and does not require any particular orientation of the item described.

As various changes could be made in the above constructions and methods without departing from the scope of the disclosure, it is intended that all matter contained in the above description and shown in the accompanying drawing[s] shall be interpreted as illustrative and not in a limiting sense.

What is claimed is:

1. A method for modeling the impurity concentration of a single crystal silicon ingot, the method comprising:
    pulling a first sample rod from a silicon melt disposed in a crucible, the first sample rod having a first sample rod diameter of less than 100 mm;
    measuring a first sample rod parameter related to the impurity content of the first sample rod, the first sample rod parameter being selected from the group consisting of the phosphorous concentration, boron concentration, aluminum concentration, gallium concentration, arsenic concentration, indium concentration, antimony concentration, total impurity concentration, dopant concentration, and resistivity of the first sample rod;
    pulling a second sample rod from the silicon melt, the second sample rod having a first sample rod diameter of less than 100 mm;
    measuring a second sample rod parameter related to the impurity content of the second sample rod, the second sample rod parameter being selected from the group consisting of the phosphorous concentration, boron concentration, aluminum concentration, gallium concentration, arsenic concentration, indium concentration, antimony concentration, total impurity concentration, dopant concentration, and resistivity of the second sample rod; and
    determining the impurity concentration of a single crystal silicon ingot based at least in part on a rate of change in the difference between the measured first sample rod parameter and the measured second sample rod parameter.

2. The method as set forth in claim 1 wherein the first sample rod parameter and the second sample rod parameter is the same parameter.

3. The method as set forth in claim 1 wherein the first sample rod diameter and the second sample rod diameter is each less than about 50 mm.

4. The method as set forth in claim 1 wherein the first sample rod diameter and the second sample rod diameter is each less than about 25 mm.

5. The method as set forth in claim 1 wherein the first sample rod diameter and the second sample rod diameter from about 5 mm to about 100 mm.

6. The method as set forth in claim 1 further comprising:
    pulling a third, fourth, fifth, sixth, seventh, eighth, ninth and/or tenth sample rod from the melt, the diameter of each sample rod being less than about 100 mm; and
    measuring a sample rod parameter related to the impurity content for each sample rod pulled from the melt.

7. The method as set forth in claim 1 wherein the impurity concentration of a single crystal silicon ingot is determined from a model, the first sample rod parameter and the second sample rod parameter being input into the model.

8. The method as set forth in claim 1 further comprising pulling a product ingot from the melt, the single crystal silicon ingot in which the impurity concentration is determined being the product ingot pulled from the melt.

9. The method as set forth in claim 1 wherein the melt is a first melt, the method further comprising:
    pulling a first product ingot from the first melt; and
    pulling a second product ingot from a second melt, the single crystal silicon ingot in which the impurity concentration is determined being the second product ingot pulled from the second melt.

10. The method as set forth in claim 9 wherein the diameter of the first and second sample rods are each less than 0.75 times the diameter of the product ingot.

11. The method as set forth in claim 1 wherein the impurity concentration is an impurity concentration of a portion of the single crystal silicon ingot.

12. The method as set forth in claim 1 wherein the impurity concentration is concentration of one or more impurities over the length of the single crystal silicon ingot.

13. The method as set forth in claim 1 further comprising annealing each sample rod in a thermal donor kill cycle prior to measuring the first and second sample rod parameters.

14. The method as set forth in claim 13 wherein the sample rods are annealed at a temperature of at least about 500° C.

15. The method as set forth in claim 14 wherein a length of the anneal is at least about 5 seconds.

16. The method as set forth in claim 13 wherein a length of the anneal is from about 5 seconds to about 5 minutes.

17. The method as set forth in claim 13 further wherein the sample rod is annealed at a temperature of at least about 650° C.

* * * * *